United States Patent
Teranishi et al.

[19]

[11] Patent Number: 6,117,183
[45] Date of Patent: Sep. 12, 2000

[54] INTERACTIVE CAD APPARATUS FOR DESIGNING PACKAGING OF LOGIC CIRCUIT DESIGN

[75] Inventors: Mieko Teranishi; Yoshiyuki Iwakura, both of Yokohama; Masaharu Nishimura, Kawasaki; Akira Katsumata, Kawasaki; Masato Ariyama, Kawasaki, all of Japan

[73] Assignee: Fujitsu Limited, Kawasaki, Japan

[21] Appl. No.: 08/894,695

[22] PCT Filed: Jan. 8, 1997

[86] PCT No.: PCT/JP97/00015

§ 371 Date: Aug. 26, 1997

§ 102(e) Date: Aug. 26, 1997

[87] PCT Pub. No.: WO97/25681

PCT Pub. Date: Jul. 17, 1997

[30] Foreign Application Priority Data

Jan. 8, 1996 [JP] Japan .......................................... 8-720

[51] Int. Cl.[7] .................................................. G06F 17/50
[52] U.S. Cl. ................................................... 716/11; 716/6
[58] Field of Search ........................ 395/500.02, 500.03, 395/500.06, 500.07, 500.12, 500.11, 500.15, 500.4; 716/1, 2, 5, 6, 10, 11, 14

[56] References Cited

U.S. PATENT DOCUMENTS

| | | | |
|---|---|---|---|
| 5,623,418 | 4/1997 | Rostoker et al. | 395/500.02 |
| 5,642,286 | 6/1997 | Yamada et al. | 364/468.03 |
| 5,663,889 | 9/1997 | Wakita | 364/490 |
| 5,787,268 | 7/1998 | Sugiyama et al. | 395/500 |

FOREIGN PATENT DOCUMENTS

| | | |
|---|---|---|
| 4-148277 | 5/1992 | Japan . |
| 4-235680 | 8/1992 | Japan . |
| 4-243484 | 8/1992 | Japan . |
| 5-334397 | 12/1993 | Japan . |
| 5-334399 | 12/1993 | Japan . |
| 6-124320 | 5/1994 | Japan . |

*Primary Examiner*—Paul R. Lintz
*Assistant Examiner*—Leigh Marie Garbowski
*Attorney, Agent, or Firm*—Staas & Halsey, LLP

[57] ABSTRACT

Disclosed is an interactive CAD apparatus for logic circuit packaging design, wherein provisions are made to display delay times in real time when a component is being moved, so that error-contributing components and interconnections can be easily identified and the optimum position can be easily determined. The apparatus includes: a component moving unit, responsive to an operator's instruction, for moving a component on a display screen where a component placement diagram is displayed; an associated path extraction unit for extracting a signal path associated with the component being moved by the component moving unit; a temporary position calculation unit for calculating temporary position data representing a placement position corresponding to the position of the component on the display screen at prescribed intervals of time when the component is being moved by the component moving unit; an associated path delay calculation unit for successively calculating delay values for the signal path extracted by the associated path extraction unit, based on the temporary position data calculated by the temporary position calculation unit; and an associated path delay display unit for successively displaying the delay values calculated by the associated path delay calculation unit.

25 Claims, 11 Drawing Sheets

INTERACTIVE CAD APPARATUS FOR DESIGNING PACKAGING OF LOGIC CIRCUIT DESIGN

TECHNICAL FIELD

The present invention relates to an interactive CAD apparatus that enables the packaging design, that is, the component placement and routing design, of a logic circuit to be performed while verifying that delay times through signal paths in the logic circuit meet prescribed design requirements.

BACKGROUND ART

A logic circuit cannot operate at the specified speed unless signal delay time is within a target cycle time for all signal paths from flip-flop to flip-flop (or equivalent element). Therefore, after doing logic design, delay analysis must be performed at the stage of packaging design (placement of logic components and design of their interconnection routing) to verify whether the circuit operates correctly. That is, the packaging design is done so that all signal paths come within the target cycle time.

Signal path delay time is the sum of the delay time within each component and the delay time due to interconnection between components. The delay time within each component is stored in a library as component design data. As LSI speed increases, the proportion of the delay due to interconnection between LSI devices can become substantial, and the length of interconnection can vary greatly depending on the component placement. This increases the importance of the delay analysis at the packaging design stage.

In some cases, the delay analysis is carried out tentatively at a stage before working on routing design, in order to optimize the component placement as much as possible, and in other cases, it is carried out after completing the interconnection routing. Further, the component placement and routing in the packaging design process may be carried out wholly by a designer, or may be carried out first using an automatic process by CAD and then corrected by a designer to complete the design.

However, the prior art delay analysis process in packaging design using CAD involves the following problems. The designer iteratively performs operations which involve moving components, checking values after placement, and determining the placement if problems are solved or moving the components again if they are not solved. The prior art process involving moving and rearranging the components, therefore, takes time in processing. The processing time is further lengthened by subsequent recalculations of delay values for all signal paths. Since the designer moves the components by making guesses, it is not uncommon that an error path occurs again, and thus the time required for iterative processing becomes considerable. Here, one problem is that the results of checking are not known until after rearranging the components. Another problem is that the side effect resulting from moving the components, that is, the increase in the delay time in other signal paths, is also not known.

Furthermore, in determining the optimum placement of the components, not only the signal path delay time described above but the ease of interconnection routing must also be considered.

DISCLOSURE OF THE INVENTION

In view of the above-outlined problems, an object of the present invention is to provide an interactive CAD apparatus for logic circuit packaging design, wherein provisions are made to display delay times in real time when a component is being moved, so that error-contributing components and interconnections can be easily identified and the optimum component placement position can be easily determined.

Another object of the present invention is to provide an interactive CAD apparatus for logic circuit packaging design, wherein provisions are made so that the ease of interconnection routing can be checked in real time together with delay times when a component is being moved.

To achieve the above objects, according to the present invention, there is provided an interactive CAD apparatus for logic circuit packaging design, comprising: component moving means, responsive to an operator's instruction, for moving a component on a display screen where a component placement diagram is displayed; associated path extraction means for extracting a signal path associated with the component being moved by the component moving means; temporary position calculation means for calculating temporary position data representing a placement position corresponding to the position of the component on the display screen at prescribed intervals of time when the component is being moved by the component moving means; associated path delay calculation means for successively calculating delay values for the signal path extracted by the associated path extraction means, based on the temporary position data calculated by the temporary position calculation means; and associated path delay display means for successively displaying on the display screen the delay values calculated by the associated path delay calculation means.

According to the present invention, there is also provided an interactive CAD apparatus for logic circuit packaging design, comprising: component moving means, responsive to an operator's instruction, for moving a component on a display screen where a component placement diagram is displayed; temporary position calculation means for calculating temporary position data representing a placement position corresponding to the position of the component on the display screen at prescribed intervals of time when the component is being moved by the component moving means; associated path delay calculation means for successively calculating delay values for a signal path specified by an operator, based on the temporary position data calculated by the temporary position calculation means; and associated path delay display means for successively displaying on the display screen the delay values calculated by the associated path delay calculation means.

According to the present invention, there is also provided an interactive CAD apparatus for logic circuit packaging design, comprising: component moving means, responsive to an operator's instruction, for moving a component on a display screen where a component placement diagram is displayed; associated path extraction means for extracting a signal path associated with the component being moved by the component moving means; temporary position calculation means for calculating temporary position data representing a placement position corresponding to the position of the component on the display screen at prescribed intervals of time when the component is being moved by the component moving means; channel pass count calculation means for calculating, based on the temporary position data calculated by the temporary position calculation means, the number of signal paths that pass across each interconnection channel associated with an interconnection route of the signal path extracted by the associated path extraction means; and channel pass count display means for successively displaying the number of signal paths calculated by the channel pass count calculation means in the form of a graph on the display screen.

According to the present invention, there is also provided an interactive CAD apparatus for logic circuit packaging design, comprising: component moving means, responsive to an operator's instruction, for moving a component on a display screen where a component placement diagram is displayed; associated path extraction means for extracting a signal path associated with the component being moved by the component moving means; temporary position calculation means for calculating temporary position data representing a placement position corresponding to the position of the component on the display screen at prescribed intervals of time when the component is being moved by the component moving means; mesh pass count calculation means for calculating, based on the temporary position data calculated by the temporary position calculation means, the number of signal paths that pass across each interconnection mesh associated with an interconnection route of the signal path extracted by the associated path extraction means; and interconnection crowdedness map display means for successively displaying the degree of interconnection crowdedness of each interconnection mesh in the form of a map on the display screen in accordance with the magnitude of the number of signal paths calculated by the mesh pass count calculation means.

BEST MODE FOR CARRYING OUT THE INVENTION

Before describing a preferred embodiment of the present invention, one example of the prior art will be described.

Figure 1:
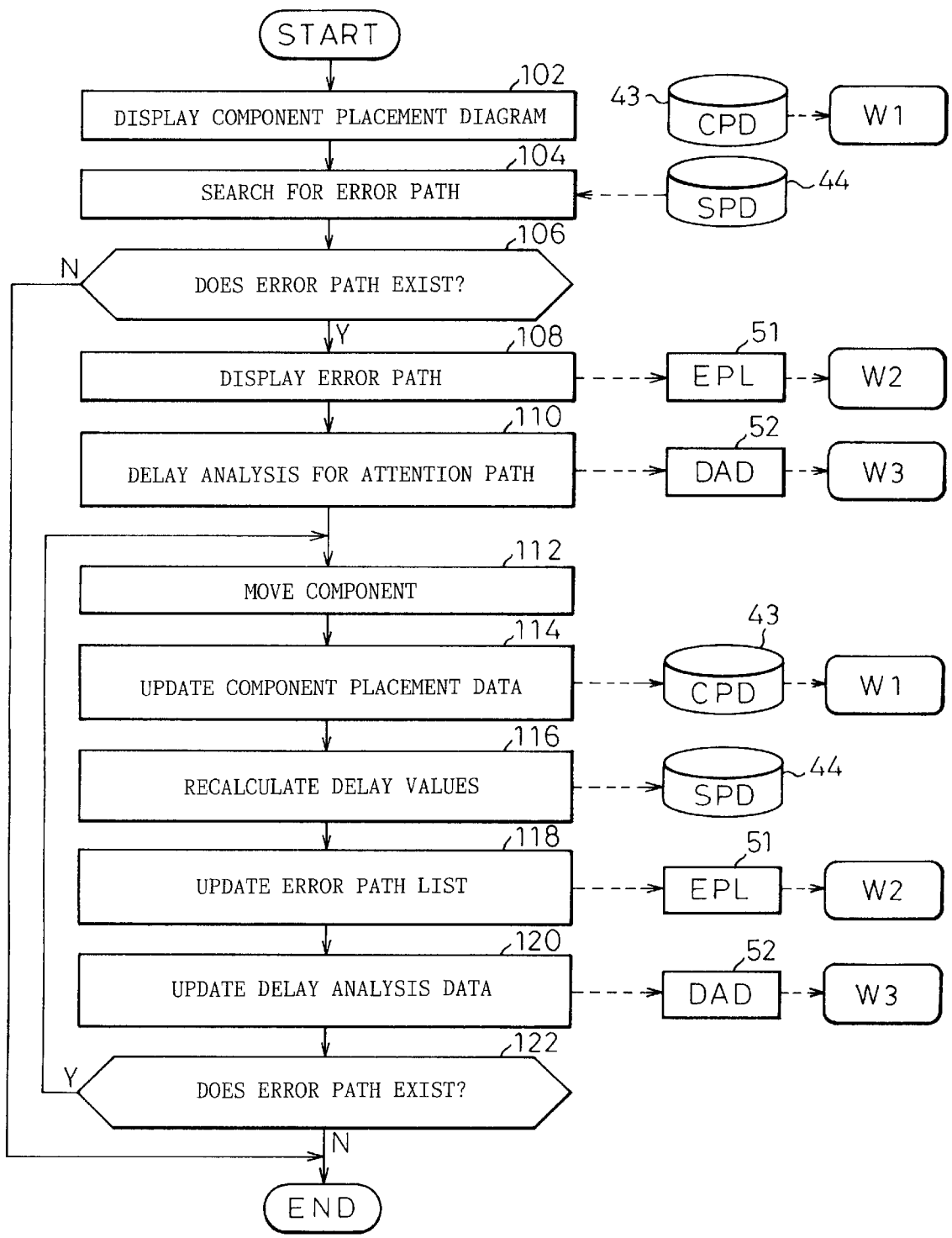
FIG. 1 is a flowchart illustrating a procedure for delay analysis performed in packaging design using a CAD apparatus according to the prior art.

A procedure for delay analysis performed in packaging design using a CAD apparatus according to the prior art is illustrated in the flowchart of FIG. 1. First, based on component placement data (CPD) 43 stored in a design data file after completing component placement design (or further, routing design), the CAD apparatus displays a component placement diagram, such as shown in a window W1 in FIG. 2, on a display screen (step 102). Next, based on signal path data (SPD) 44 containing a delay value calculated for each signal path from the component placement data, the CAD apparatus extracts a signal path that does not satisfy a target cycle time as an error path (step 104).

If an error path exists, a table 51 of an error path list (EPL) is constructed in memory under the direction of an operator (designer) (steps 106, 108). This list is constructed by sorting error paths in order of decreasing delay time or by giving priority to paths associated with a designated component. The reason is that when the device increases in size or complexity, a large number of error paths may be detected (especially, in verification at early stages of the design), and in such cases, the amount of listed contents will become enormous, making it difficult to locate problematic signal paths. The list is displayed in a window on the display screen. For example, as shown in the screen display example of FIG. 2, the error path list is displayed with its contents arranged in order of decreasing delay time in a window W2 different from the window W1 where the component placement diagram is displayed. The illustrated example shows the result of verification done based on a cycle time of 2000.00 ps. Of the seven paths listed, six error paths exceeding the cycle time are detected and labelled an error mark E. Here, it is apparent that the number of signal paths displayed is limited by the size of the window.

Figure 2:
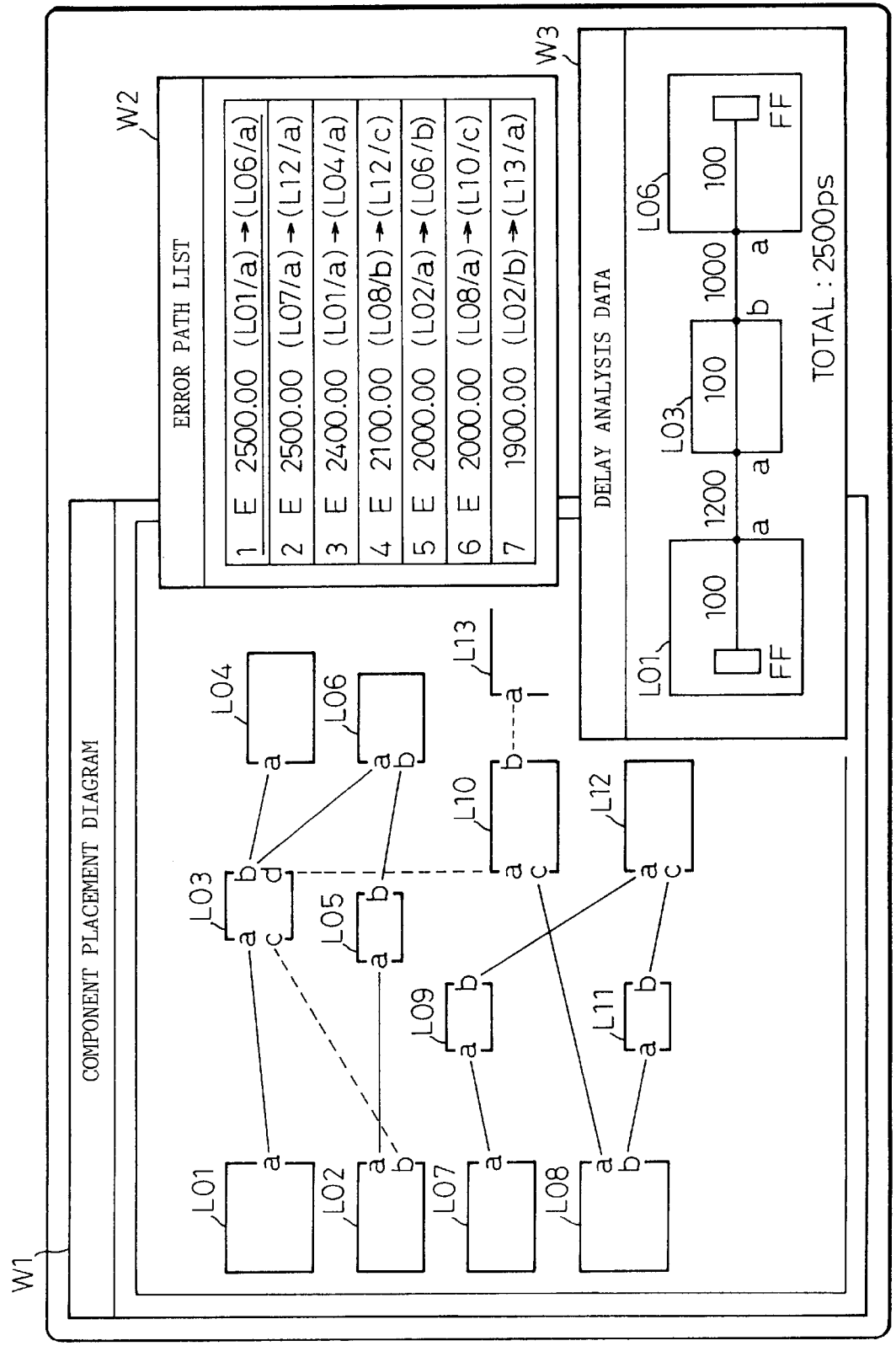
FIG. 2 is a diagram showing an example of a placement design screen in the CAD apparatus, wherein an error path list is sorted in decreasing magnitude of error.

Next, the operator selects an attention path from the displayed error path list, and the delay associated with the attention path is analyzed (step 110). More specifically, a signal path having the worst path delay value, or signal paths associated with a particular component, for example, are selected from within the window W2. If attention is directed to a signal path with the worst path delay value, for example, the path No. 1 or No. 2 with 2500.00 ps will be selected; on the other hand, if attention is directed to a particular component L01, the path L01/a→L06/a, labelled No. 1, and the path L01/a→L04/a, labelled No. 3, will be selected. In the example shown in FIG. 2, the path No. 1 is specified. Designation "L01/a" indicates terminal a of component L01. For the specified signal path, the CAD apparatus creates detailed information concerning interconnection delay between components (SSI, LSI, or other devices) forming the signal path, internal delay within each component, etc., and constructs a delay analysis data (DAD) table 52 which is stored in memory. Its contents also are displayed as a separate window W3. In the example of FIG. 2, only one signal path is displayed, but it is also possible to specify two or more signal paths.

Figure 3:
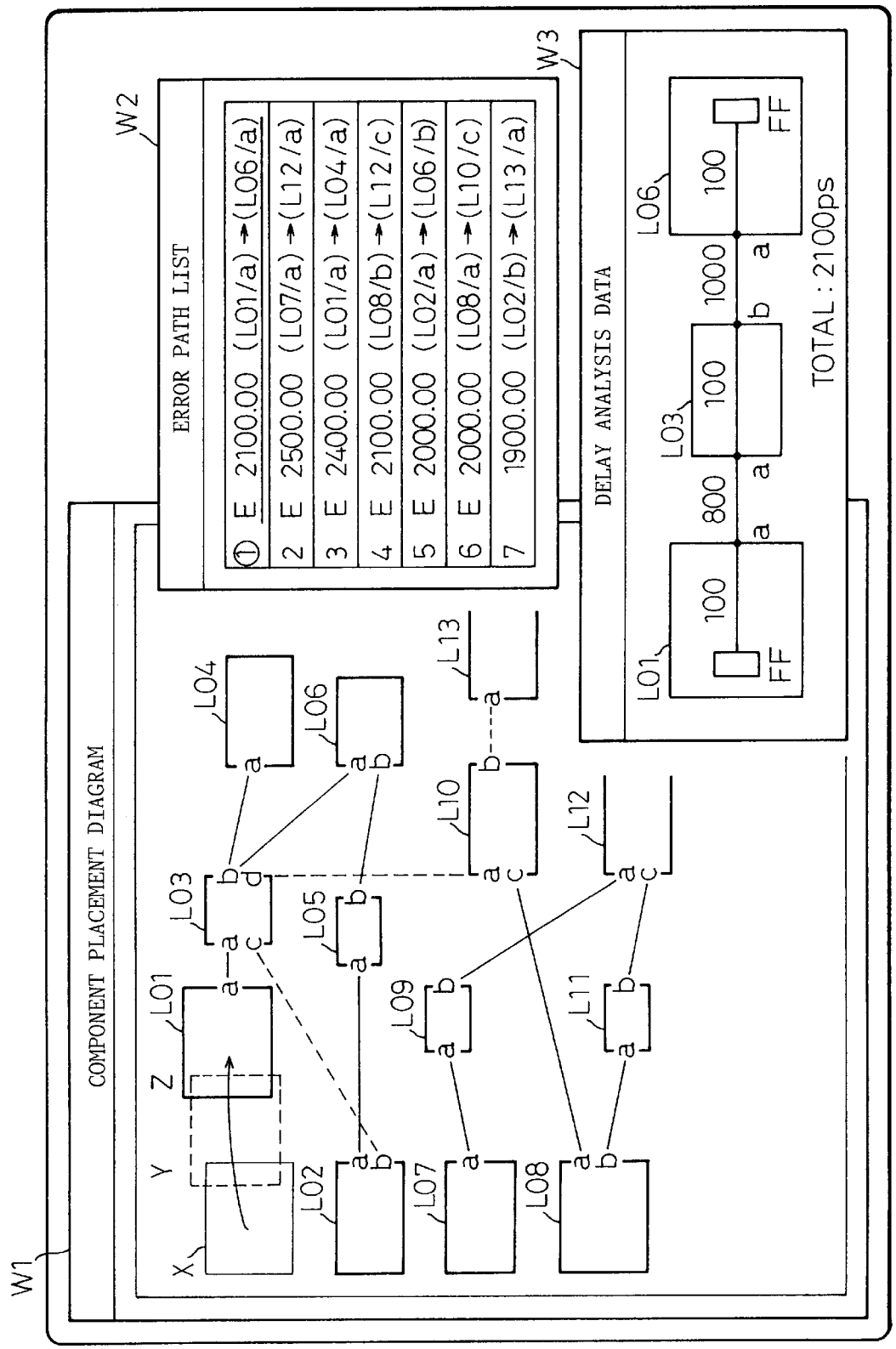
FIG. 3 is a diagram showing an example of the placement design screen in the CAD apparatus after moving a component.

Next, the operator enters an instruction to move an associated component to adjust the interconnection length between components in order to minimize the interconnection delay associated with the problematic signal path (step 112). For example, as shown in FIG. 3, the component L01 is moved from its original position X to a new position Z, by specifying the component with a mouse and dragging it. The CAD apparatus performs component relocation processing in accordance with the instruction, and updates the component placement data 43 (step 114).

Next, the CAD apparatus recalculates the delay values for all the signal paths, and updates the signal path data (SPD) 44 (step 116). Then, the contents of the error path list (EPL) 51 are updated, and the display contents of the window W2 change as shown in FIG. 3 (step 118). Likewise, the inter-LSI delay values and total delay value in the delay analysis data (DAD) 52 are updated, and the display contents of the window W3 change accordingly (step 120). For the signal path whose associated error is eliminated, the error mark (E)

is removed from the error path list. If there occurs a new error path as the result of changing the component position, such an error path is added to the error path list. In the illustrated example, 2500 ps is only reduced to 2100 ps, and the error is not eliminated yet. When the error is not eliminated yet, the process returns to step 112 to repeat the above procedure (step 122).

In the above-described prior art, when the component L01 is moved from position X to position Z to reduce the delay associated with the signal path L01→L06 in FIG. 3, for example, the recalculation of the delay values is performed after completion of the component relocation, that is, after the component has been moved to position Z. In the illustrated example, the delay value for L01→L03 is reduced from 1200 ps to 800 ps, but the total delay value still does not satisfy the cycle time of 2000.00 ps, so that the component relocation work has to be performed over again. However, in cases where the interconnection is routed going around the path, for example, it is possible that the error may have been eliminated at an intermediate position Y along the route. Accordingly, the process has to be performed iteratively, trying to find such a position. These iterations greatly affect development man-hours.

Figure 4:
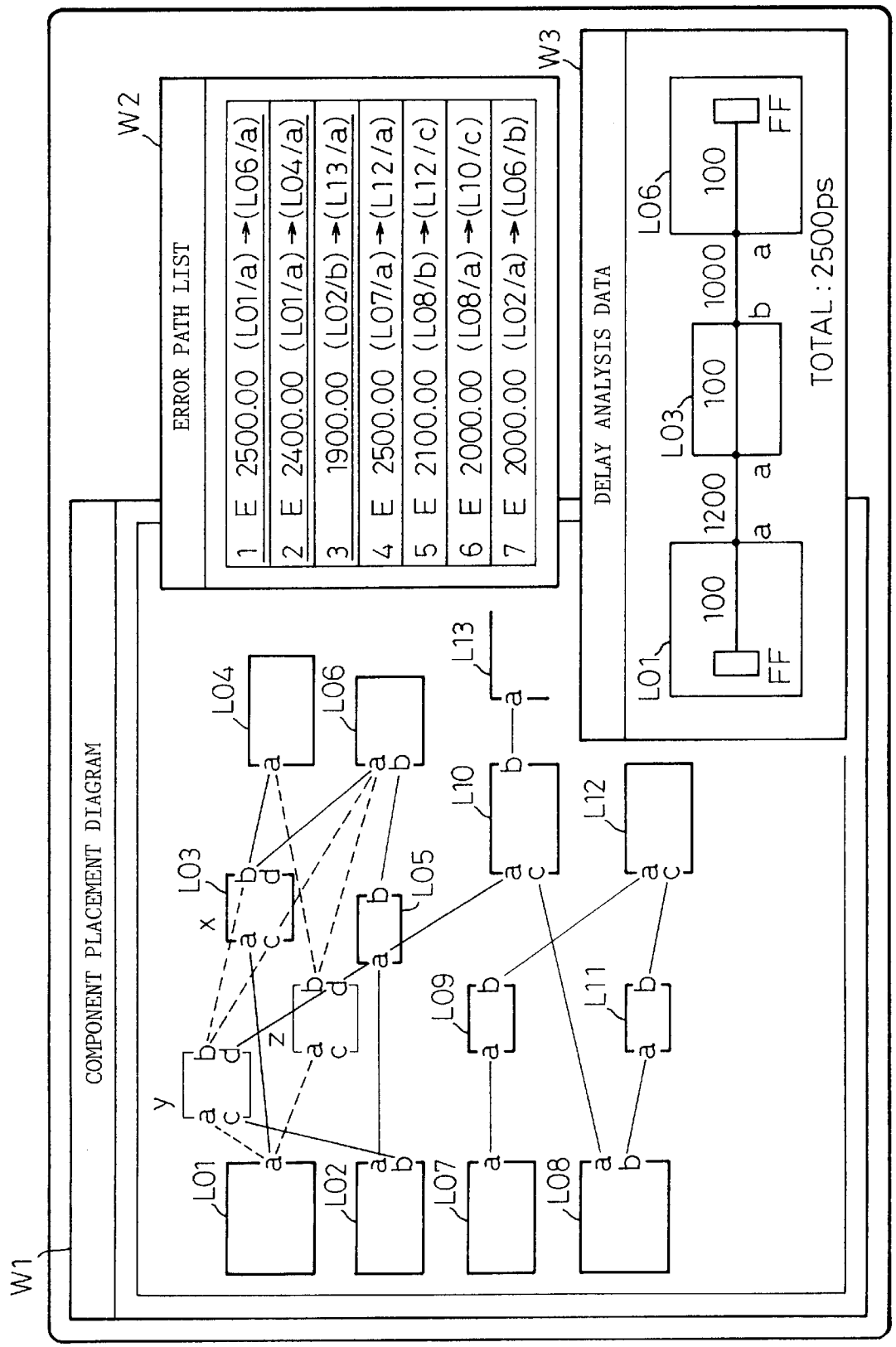
FIG. 4 is a diagram showing an example of the placement design screen in the CAD apparatus, wherein attention is directed to component L03.

The error path list shown in the window W2 in FIG. 4 concerns an example in which the list is sorted based on an attention component. In the component placement diagram shown in the window W1 in FIG. 4, when the attention paths L01/a→L03/a→L03/b→L06/a and L01/a→L03/a→L03/b→L04/a are associated with the component L03, if the delay is to be reduced by moving L03, changes in delay values should also occur in other signal paths L02/b→L03/c→L03/d→L10/a→L10/b→L13/a, etc. as the result of moving the component L03, but its influence is not readily seen from the figure. For example, if the component L03 is moved to position y, the attention paths are improved, but it is possible that some other signal path could worsen and become an error path. Trial-and-error procedures are inevitable to find a position (for example, position z) that satisfies both of the needs. This is not much of a problem for a simple circuit such as the one shown here, but if the number of connecting terminals of a component is large, it will become impossible to see clearly how an improvement can be achieved by moving the component. In FIG. 4, the connection of the signal path L02/b→L13/a, labelled No. 3, is not shown since it is not an error path when the component L03 is located in position x or z.

Figure 5:
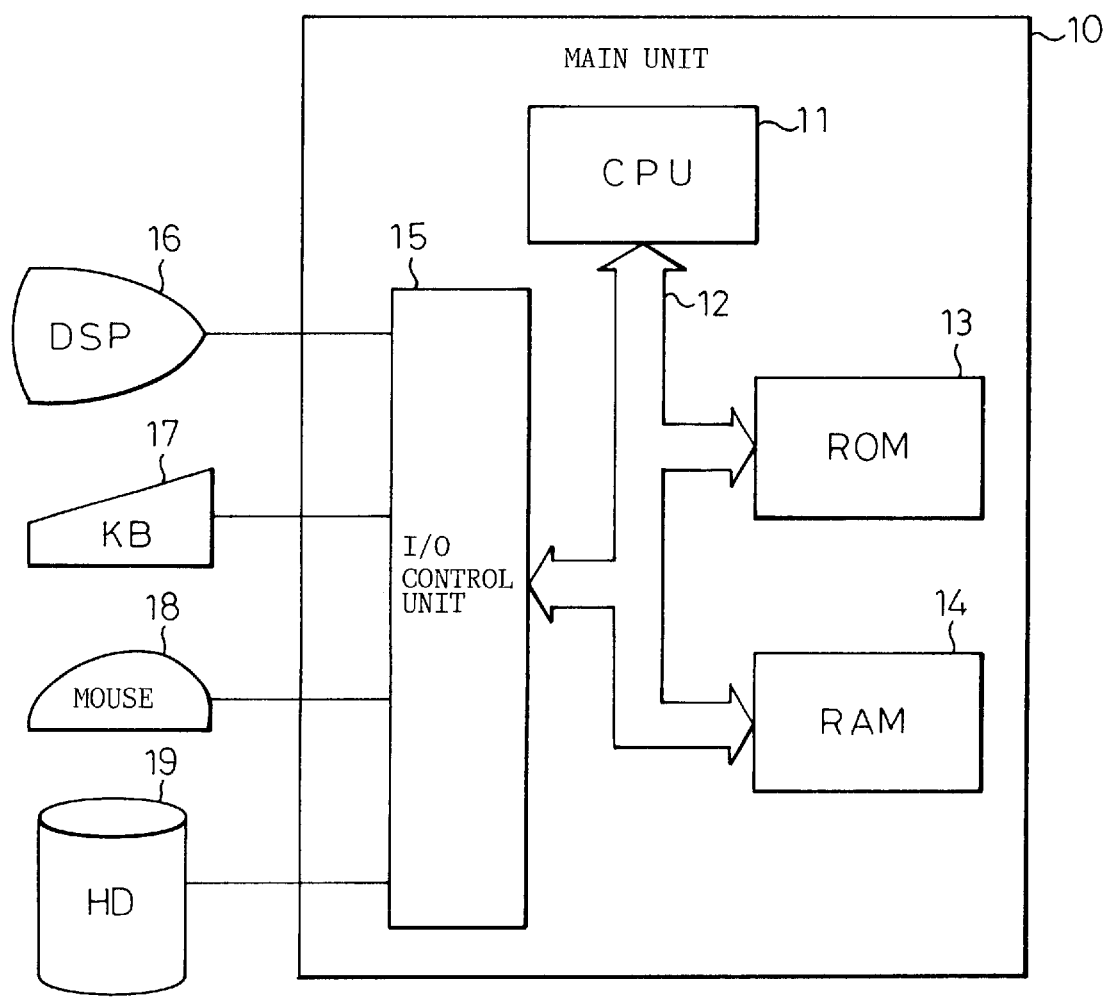
FIG. 5 is a block diagram showing one example of the hardware configuration of a CAD apparatus.

An embodiment of the present invention which overcomes the above-described problems in the prior art will be described below. FIG. 5 is a block diagram showing one example of the hardware configuration of a CAD apparatus according to one embodiment of the present invention. As shown in the figure, the main unit 10 of the CAD apparatus comprises a central processing unit (CPU) 11 consisting of a general-purpose microprocessor, a read-only memory (ROM) 13 for storing a program, a random-access memory (RAM) 14 used as a temporary data storage, and an input/output control unit 15 for controlling input/output devices. These elements are interconnected by a system bus 12 consisting of an address bus, a data bus, and a control bus. To the input/output control unit 15 are connected a display 16, a keyboard 17, a mouse 18, and a hard disk unit 19.

Figure 6:
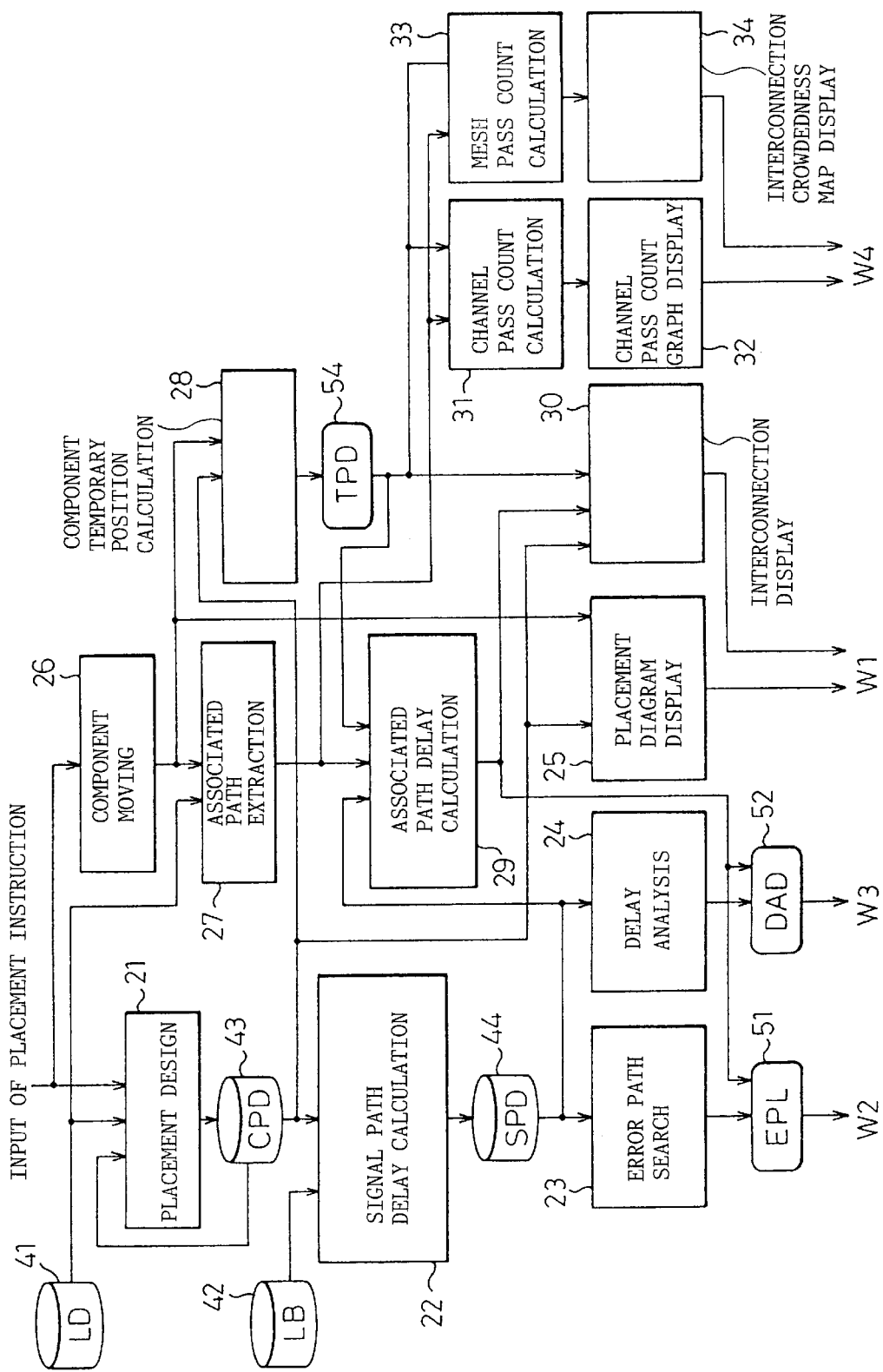
FIG. 6 is a diagram showing the software configuration of the CAD apparatus according to one embodiment of the present invention.

FIG. 6 is a diagram showing the configuration of software that runs on the CPU 11 of FIG. 1; portions shown here concern the packaging design of a logic circuit. A placement design routine 21, in accordance with the input of a placement instruction, generates component placement data (CPD) 43 from logic design data (LD) 41 generated in the logic design stage. Its contents are displayed on the display 16, by a placement diagram display routine 25, as a component placement diagram similar to the one shown in the window W1 in FIG. 4.

A signal path delay calculation routine 22 generates signal path data (SPD) 44 by using the component placement data (CPD) 43 and library (LB) 42 (where component delay data, substrate delay data, etc. are stored). An error path search routine 23, based on the signal path data (SPD) 44, extracts signal paths causing delays longer than a specified delay time and generates an error path list (EPL) 51. A delay analysis routine 24 generates detailed delay analysis data (DAD) 52 in accordance with an operator's instruction. The EPL 51 and DAD 52 are each stored as a table within the RAM 14. Their contents are displayed in windows W2 and W3, respectively.

A component moving routine 26 detects the operator specifying and dragging a component by using the mouse 18, and moves the component on the display screen via the placement diagram display routine 25. An associated path extraction routine 27, based on the logic design data (LD) 41, extracts signal paths associated with the component being moved. When the component is being moved, a component temporary position calculation routine 28 calculates, at prescribed intervals of time, temporary position data (TPD) 54 representing the placement position corresponding to the position of the component on the display screen by correcting the original component placement data (CPD) 43 on the basis of the distance over which the component is moved.

An associated path delay calculation routine 29 successively calculates, based on the temporary position data (TPD) 54 successively calculated by the component temporary position calculation routine 28, delay values for the associated paths extracted by the associated path extraction routine 27, obtains the change in the interconnection delay as the component is moved, and based on the obtained result, constantly updates the error path list (EPL) 51 and delay analysis data (DAD) 52. Accordingly, the delay values displayed in the windows W2 and W3 change as the component is moved. The associated path delay calculation routine 29 is also constructed so that delay values for paths specified by the operator can be calculated, independently of the associated path extraction routine 27.

Here, it is only necessary to calculate data concerning the particular component, that is, the component being moved, and the calculation can be accomplished simply, for example, by adding the increase or decrease of the time delay associated with the increase or decrease in distance in the X and Y directions to the original value. Since the calculation time is short, the component position can be calculated and displayed in real time as the mouse is moved. The position where the component is placed can thus be moved around in a trial-and-error manner to find the optimum position. After that, the placement is finally determined and checked, and the result of the check is verified, as in the prior art.

An interconnection display routine 30 displays the interconnections of the associated signal paths on the component placement diagram. The interconnections to be displayed may be represented by straight lines interconnecting the terminals of the components, as shown in FIG. 4, for example, or alternatively, the interconnections may be displayed along the actually routed lines. When displaying the interconnections, the interconnecting lines shown in the component placement diagram are displayed in different colors for different error levels. For example, an error path is displayed in red and an improved path in green; it is also possible to classify the signal paths according to their values expressed in percentage of a verification reference value and to display a path with a value exceeding 150% in red, 150 to 100% in pink, 100 to 80% in yellow, and less than 80% no display, for example. Alternatively, the line thickness or line type may be changed to display different error levels.

Figure 7:
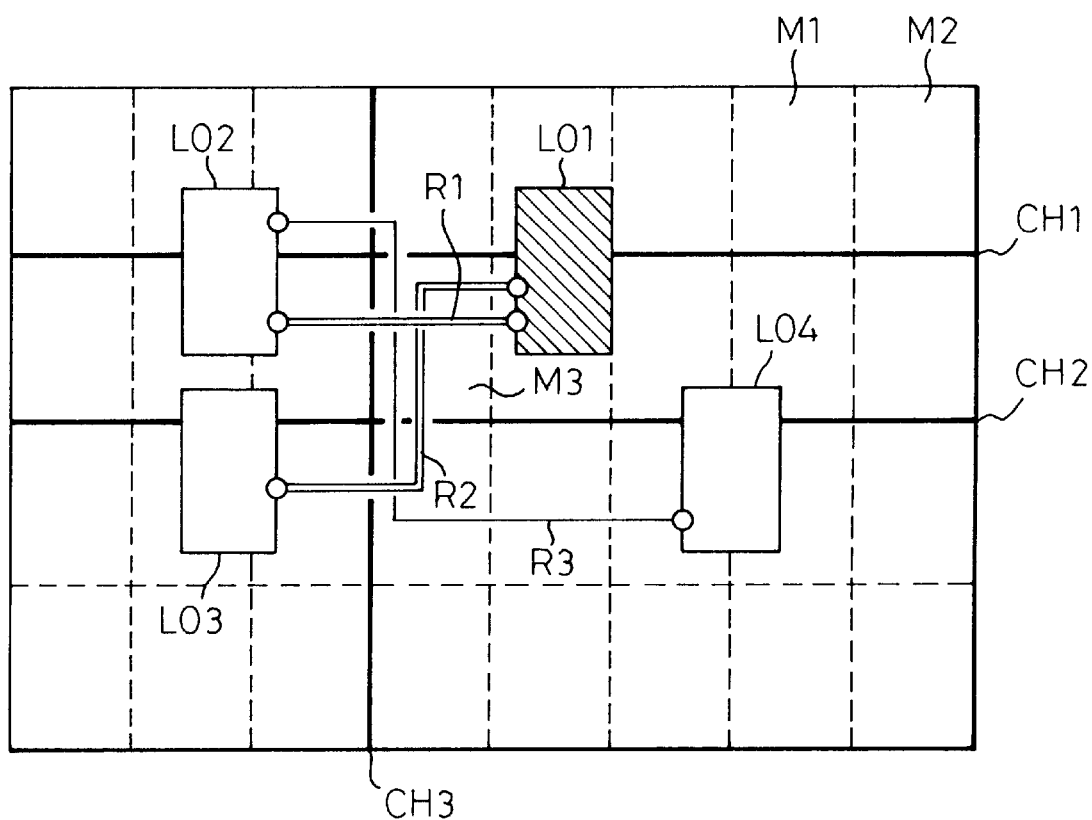
FIG. 7 is a diagram for explaining interconnection channels and interconnection meshes.

A channel pass count calculation routine 31 calculates the number of signal paths that pass across each of the interconnection channels associated with the interconnection routes of the associated paths. For example, FIG. 7 shows four components, L0, L02, L03, and L04, and three interconnections, R1, R2, and R3. Here, if it is assumed that the component L01 is the component being moved, then the associated paths are the interconnections R1 and R2 of the signal paths connected to the pins of the component L01. The associated path R2, for example, passes across interconnection channels CH2 and CH3, which are therefore the channels for which the channel pass counts are to be calculated by the channel pass count calculation routine 31. In the illustrated example, the number of signal paths passing across the interconnection channel CH2 is two, that is, R2 and R3, and the number of signal paths passing across the interconnection channel CH3 is three, that is, R1, R2, and R3.

Figure 8:
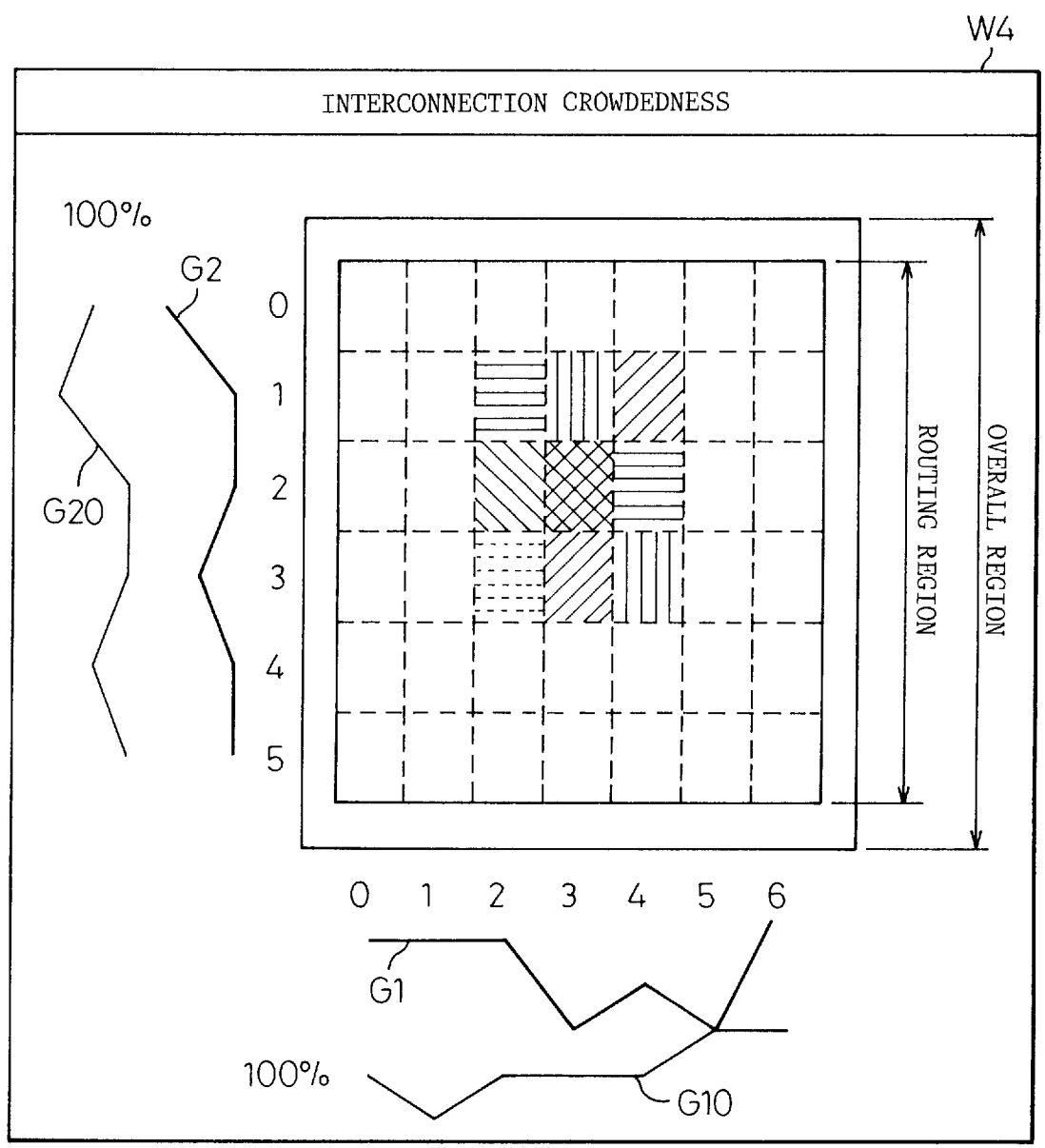
FIG. 8 is a diagram showing a window for displaying interconnection crowdedness.

A channel pass count display routine 32 displays a channel pass count graph on the screen, based on the calculated results from the channel pass count calculation routine 31. The channel pass count graph, as shown by G1 and G2 in FIG. 8, shows the number of interconnections passing across each channel in the form of a line graph. Here, kinked lines G10 and G20 represent the maximum number of interconnections that can physically pass across each channel, and G1 and G2 must not exceed G10 and G20, respectively. The pass counts for the channels associated with the component being moved are calculated by the channel pass count calculation routine 31, while the pass counts for the other channels are based on routing data (not shown) obtained during the routing design.

A mesh pass count calculation routine 33 calculates the number of interconnection routes of the associated paths that pass across each interconnection mesh. Here, the interconnection mesh is one of the sections into which the entire routing region is divided horizontally and vertically, as shown by M1, M2, and M3 in FIG. 7. The paths R1 and R2 associated with the component L01 being moved pass across the interconnection mesh M3, which is therefore the interconnection mesh for which the mesh pass count is to be calculated by the mesh pass count calculation routine 33. In the illustrated example, since three interconnections, R1, R2, and R3, pass across the interconnection mesh M3, the pass count for the interconnection mesh M3 is three.

An interconnection crowdedness map display means 34 displays each interconnection mesh in a different color according to the number of interconnections passing across the interconnection mesh, as shown in FIG. 8. The pass counts for the interconnection meshes associated with the component being moved are calculated by the mesh pass count calculation routine 33, while the pass counts for the other interconnection channels are based on routing data (not shown) obtained during the routing design. The interconnection crowdedness map is displayed on the screen in a window W4 together with the earlier described channel pass count graph, and provides one of the means used to view the interconnection crowdedness during the interconnection routing or during the moving of the component.

Figure 9A:
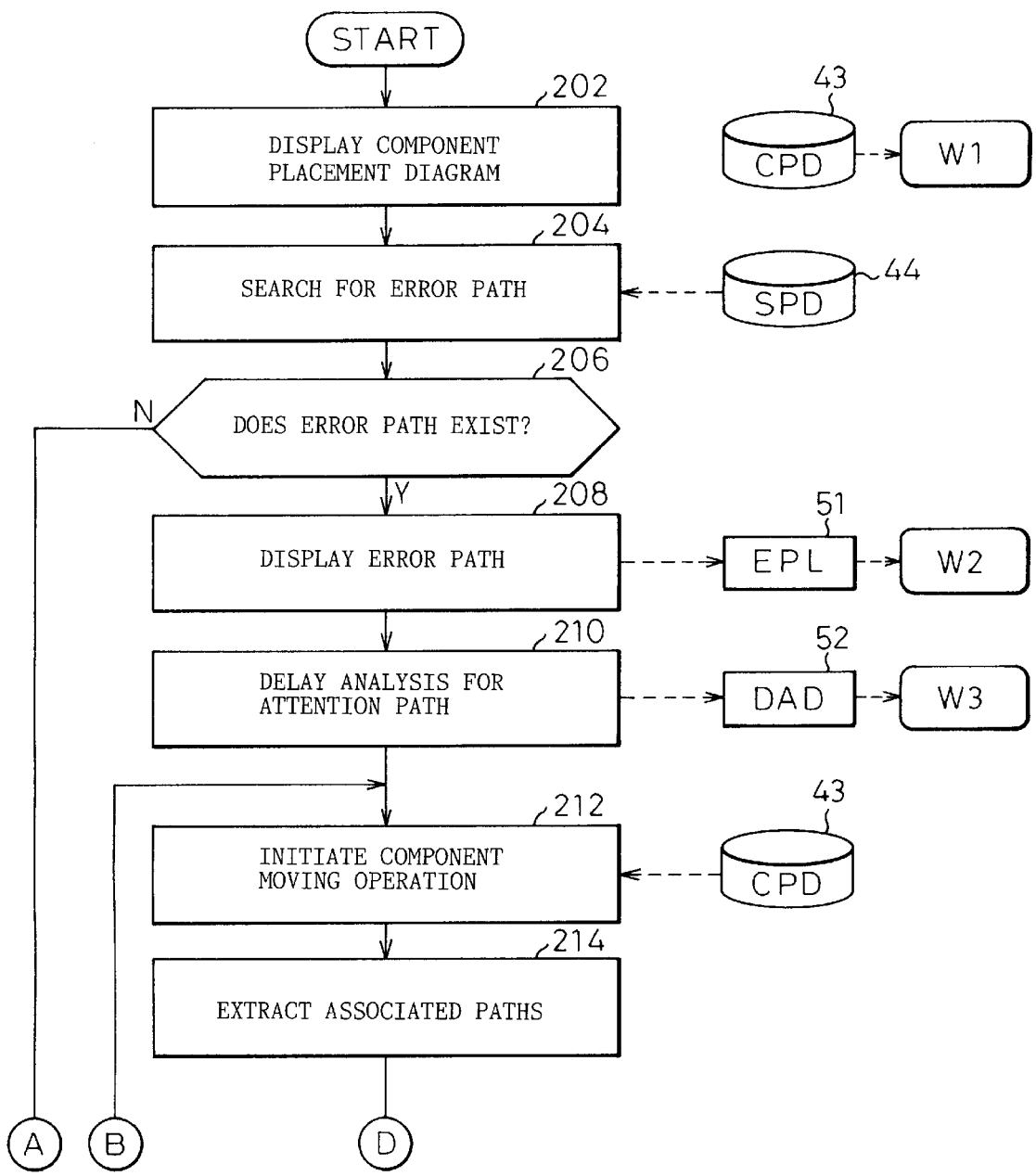
FIGS. 9A, 9B, and 9C are flowcharts illustrating a procedure for delay analysis in packaging design according to the present invention.
Figure 9B:
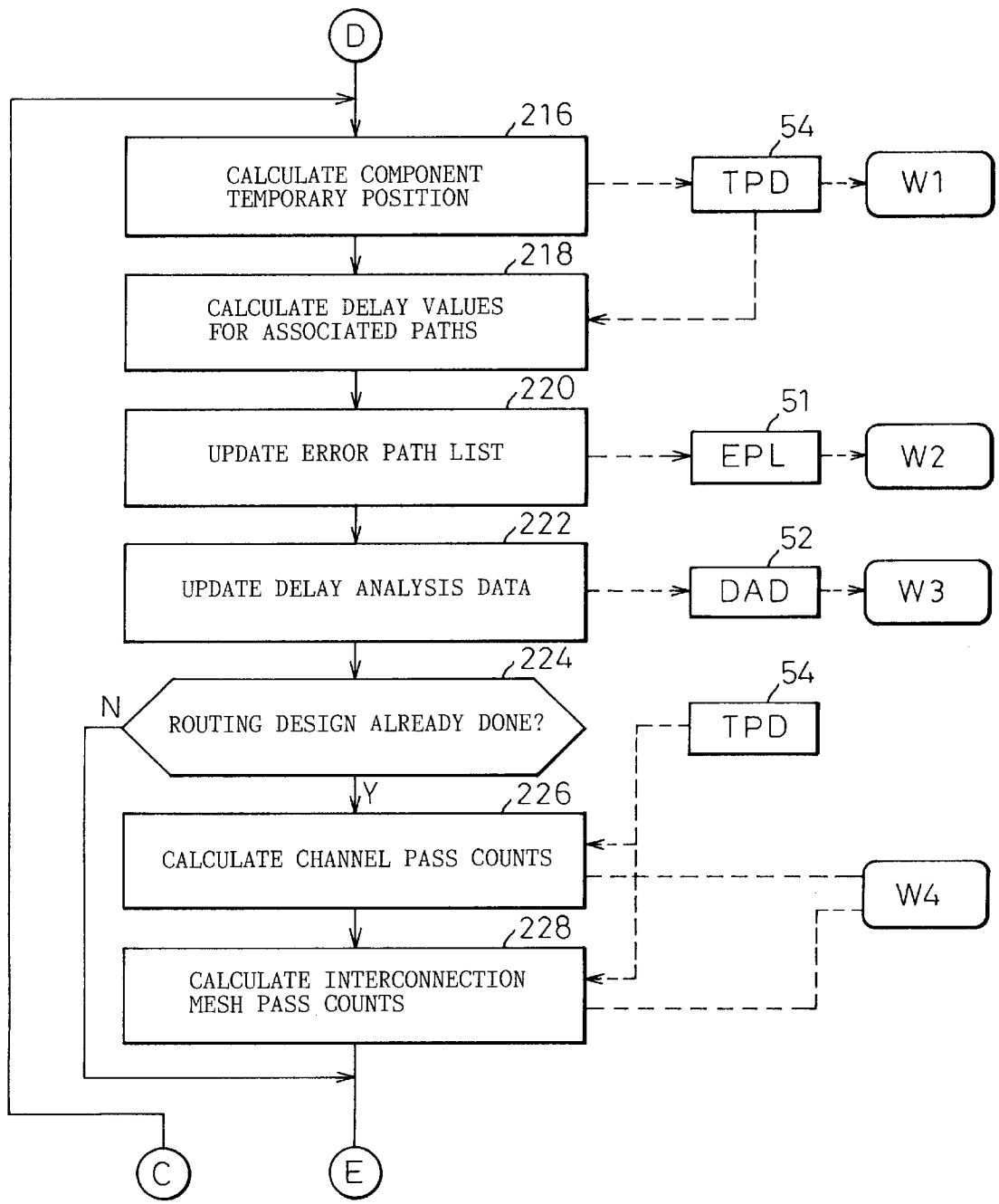
Figure 9C:
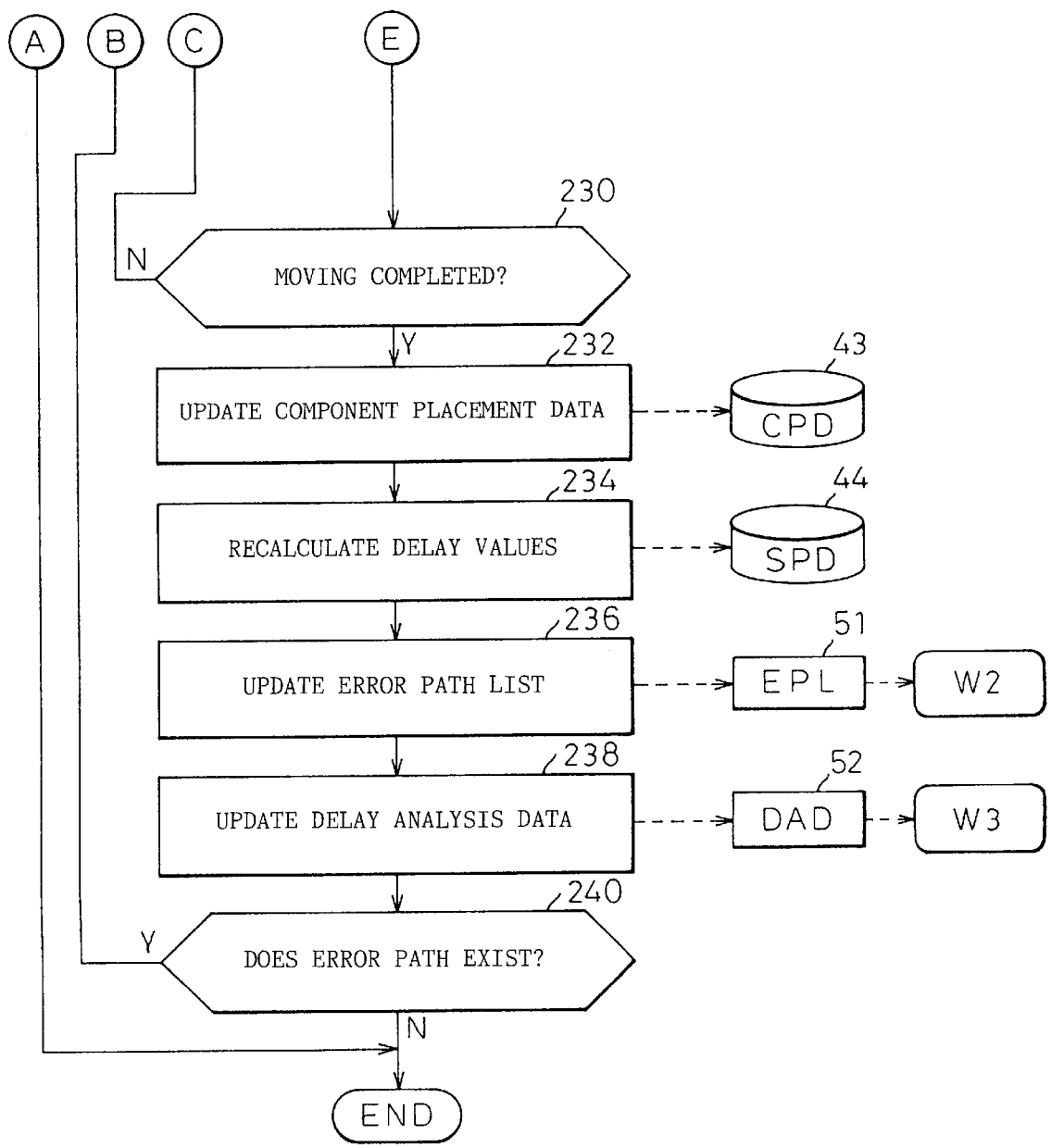

FIGS. 9A, 9B, and 9C are flowcharts illustrating a procedure for delay analysis performed in packaging design using the CAD apparatus according to the present invention. First, steps 202 to 210 are the same as steps 102 to 110 previously described with reference to FIG. 1. Next, the operator initiates the operation to move an associated component to adjust the interconnection length between components in order to minimize the interconnection delay associated with the problematic signal path (step 212). Then, the signal paths associated with the component being moved are extracted (step 214).

Next, temporary position data (TPD) 54, which represents the current position of the component being moved, is calculated (step 216). Then, based on the temporary position data, delay values for the associated paths are calculated (step 218). Based on the thus calculated delay values, the error path list (EPL) table 51 and the delay analysis data (DAD) table 52 are updated (steps 220 and 222).

Next, a decision is made as to whether routing design has already been done (step 224). If the routing design has already been done, the channel pass counts and interconnection mesh pass counts are calculated as previously described, and the results are displayed in the window W4 as shown in FIG. 8 (steps 226 and 228). These calculations are completed in a short period of time since the calculations need only be performed on the data associated with the component being moved; the change in interconnection crowdedness resulting from the moving of the component can thus be displayed in real time.

Next, in step 230, a decision is made as to whether the moving operation has been completed; if not completed yet, the process loops back to step 216, and if completed, the process proceeds to step 232 and later steps. Steps 232 to 240 are the same as steps 114 to 122 in FIG. 1.

The error path list shown in the window W2 in FIG. 4 is an example of the list constructed in accordance with an instruction to sort the list based on the component L03. In this case, when the component L01 is being moved from position x to position y or z, for example, the delay values in the error path list in the window W2 (also the delay values in the delay analysis data in the window W3, if so instructed) are updated in real time, thus displaying the delay values during the moving of the component so that the optimum position of the component can be found. If the interconnection display routine 30 is so constructed as to display the magnitude of the delay value by color, as previously described, where an error path exists and how the error can be eliminated by moving the component can be easily recognized by just seeing the colors of the interconnecting lines on the component placement diagram, without looking at the error path list or delay analysis data. After finding the optimum position in this way, the component placement data is updated.

The present embodiment has dealt with an example in which logic components such as LSI or SSI devices are arranged on a printed circuit board, but the same principle can be applied to the case of packaging design where the components consist of basic devices or macro circuits and circuit blocks and their placement within an LSI circuit is determined. The present embodiment has also shown an example of processing before designing the routing of signal lines, but fundamentally the same processing can be performed after the routing of signal lines has been designed. In that case, an easier-to-understand display can be presented by displaying the interconnections along the interconnection routes, rather than displaying them as straight lines connecting between pins as in the present embodiment.

As described above, according to the present invention, since interconnection delays are calculated and the results are displayed in real time while a component is being moved to temporarily change its position, it is possible to know how the delay values change due to interconnections, before the component placement is finally determined. Further, if the interconnecting lines on the component placement diagram are displayed differently according to the error level, the error levels can be easily recognized on the component placement diagram. Furthermore, when the component is being moved, the interconnection crowdedness can be checked in real time together with the delay times. These features serve to effectively improve delay times and greatly reduce the number of development manhours.

What is claimed is:

1. An interactive CAD apparatus for logic circuit packaging design, comprising:
    component moving means, responsive to an operator's instruction, for moving a component on a display screen where a component placement diagram is displayed;
    associated path extraction means for extracting a signal path associated with the component being moved by said component moving means;
    temporary position calculation means for calculating temporary position data representing a placement position corresponding to the position of said component on said display screen at prescribed intervals of time when said component is being moved by said component moving means;
    associated path delay calculation means for successively calculating delay values for the signal path extracted by said associated path extraction means, based on the temporary position data calculated by said temporary position calculation means; and
    associated path delay display means for successively displaying on said display screen the delay values calculated by said associated path delay calculation means.

2. An interactive CAD apparatus for logic circuit packaging design, comprising:
    component moving means, responsive to an operator's instruction, for moving a component on a display screen where a component placement diagram is displayed;
    temporary position calculation means for calculating temporary position data representing a placement position corresponding to the position of said component on said display screen at prescribed intervals of time when said component is being moved by said component moving means;
    associated path delay calculation means for successively calculating delay values for a signal path specified by an operator, based on the temporary position data calculated by said temporary position calculation means; and
    associated path delay display means for successively displaying on said display screen the delay values calculated by said associated path delay calculation means.

3. An interactive CAD apparatus for logic circuit packaging design according to claim 1, wherein said associated path delay calculation means calculates the delay values in a simplified manner based on an increase or decrease in inter-component distance as said component is moved.

4. An interactive CAD apparatus for logic circuit packaging design according to claim 1, further comprising interconnection display means for displaying associated interconnections on the screen where said component placement diagram is displayed, by successively changing the way of displaying said interconnections depending on the magnitude of the delay values successively calculated by said associated path delay calculation means.

5. An interactive CAD apparatus for logic circuit packaging design according to claim 4, wherein said associated path delay calculation means calculates the delay values in a simplified manner based on an increase or decrease in inter-component distance as said component is moved.

6. An interactive CAD apparatus for logic circuit packaging design according to claim 4, further comprising interconnection display means for displaying associated interconnections on the screen where said component placement diagram is displayed, by successively changing the way of displaying said interconnections depending on the magnitude of the delay values successively calculated by said associated path delay calculation means.

7. An interactive CAD apparatus for logic circuit packaging design, comprising:
    component moving means, responsive to an operator's instruction, for moving a component on a display screen where a component placement diagram is displayed, said component placement diagram being divided into a plurality of interconnection meshes;
    associated path extraction means for extracting a signal path associated with the component being moved by said component moving means, said signal path being comprised of at least one interconnection route;
    temporary position calculation means for calculating temporary position data representing a placement position corresponding to the position of said component on said display screen at prescribed intervals of time when said component is being moved by said component moving means;
    mesh pass count calculation means for calculating, based on the temporary position data calculated by said temporary position calculation means, the number of signal paths that pass across each interconnection mesh associated with an interconnection route of the signal path extracted by said associated path extraction means, the number of signal paths crossing each of said interconnection meshes determining a degree of interconnection crowdedness of each of said interconnection meshes; and
    interconnection crowdedness map display means for successively displaying the degree of interconnection crowdedness of each interconnection mesh in the form of a map on said display screen in accordance with the magnitude of the number of signal paths calculated by said mesh pass count calculation means.

8. An interactive CAD apparatus for logic circuit packaging design according to claim 7, wherein said interconnection crowdedness map display means displays the interconnection crowdedness of each interconnection mesh in such a manner that the degree of the crowdedness is identifiable by a color assigned thereto.

9. A method of displaying signal path delay values on a display screen in an interactive CAD apparatus for logic circuit packaging design, comprising the steps of:
    (a) moving a component, in response to an operator's instruction, on the display screen where a component placement diagram is displayed;
    (b) extracting a signal path associated with the component being moved in said step (a);

(c) calculating temporary position data representing a placement position corresponding to the position of said component on said display screen at prescribed intervals of time when said component is being moved in said step (a);

(d) successively calculating delay values for the signal path extracted in said step (b), based on the temporary position data calculated in said step (c); and (e) successively displaying on said display screen the delay values calculated in said step (d).

10. A method according to claim 8, wherein the step of successively calculating delay values for said signal path calculates the delay values in a simplified manner based on an increase or decrease in inter-component distance as said component is moved.

11. A method according to claim 8, further comprising the step of displaying associated interconnections on the screen where said component placement diagram is displayed, by successively changing the way of displaying said interconnections depending on the magnitude of the delay values successively calculated in the step of successively calculating delay values for said signal path.

12. A method of displaying a channel pass count graph in real time on a display screen in an interactive CAD apparatus for logic circuit packaging design, comprising the steps of:

(a) moving a component, in response to an operator's instruction, on the display screen where a component placement diagram is displayed;

(b) extracting a signal path associated with the component being moved in said step (a), said signal path being comprised of at least one interconnection route;

(c) calculating temporary position data representing a placement position corresponding to the position of said component on said display screen at prescribed intervals of time when said component is being moved in said step (a);

(d) displaying a plurality of horizontal and vertical interconnection channels on said component placement diagram, said interconnection routes passing across said interconnection channels;

(e) based on the temporary position data calculated in said step (c), calculating the number of signal paths that pass across each interconnection channel associated with an interconnection route of the signal path extracted in said step (b); and (f) successively displaying on said display screen a channel pass count graph showing in the form of a graph the number of signal paths calculated in said step (e).

13. A method of displaying an interconnection crowdedness map in real time on a display screen in an interactive CAD apparatus for logic circuit packaging design, comprising the steps of:

(a) moving a component, in response to an operator's instruction, on the display screen where a component placement diagram is displayed, said component placement diagram being divided into a plurality of interconnection meshes;

(b) extracting a signal path associated with the component being moved in said step (a), said signal path being comprised of at least one interconnection route;

(c) calculating temporary position data representing a placement position corresponding to the position of said component on said display screen at prescribed intervals of time when said component is being moved in said step (a);

(d) based on the temporary position data calculated in said step (c), calculating the number of signal paths that pass across each interconnection mesh associated with an interconnection route of the signal path extracted in said step (b), the number of signal paths crossing each of said interconnection meshes determining a degree of interconnection crowdedness of each of said interconnection meshes; and (e) successively displaying on said display screen an interconnection crowdedness map showing in the form of a map the degree of interconnection crowdedness of each interconnection mesh in accordance with the magnitude of the number of signal paths calculated in said step (d).

14. A method according to claim 13, wherein the step of displaying the interconnection crowdedness map displays the interconnection crowdedness of each interconnection mesh in such a manner that the degree of the crowdedness is identifiable by a color assigned thereto.

15. A program storage device readable by a computer, tangibly embodying a program of instructions executable by the computer to perform method steps for displaying signal path delay values on a display screen in an interactive CAD apparatus for logic circuit packaging design, said method steps comprising:

(a) moving a component, in response to an operator's instruction, on the display screen where a component placement diagram is displayed;

(b) extracting a signal path associated with the component being moved in said step (a);

(c) calculating temporary position data representing a placement position corresponding to the position of said component on said display screen at prescribed intervals of time when said component is being moved in said step (a);

(d) successively calculating delay values for the signal path extracted in said step (b), based on the temporary position data calculated in said step (c); and (e) successively displaying on said display screen the delay values calculated in said step (d).

16. A program storage device readable by a computer, tangibly embodying a program of instructions executable by the computer to perform method steps for displaying signal path delay values on a display screen in an interactive CAD apparatus for logic circuit packaging design, said method steps comprising:

(a) moving a component, in response to an operator's instruction, on the display screen where a component placement diagram is displayed;

(b) calculating temporary position data representing a placement position corresponding to the position of said component on said display screen at prescribed intervals of time when said component is being moved in said step (a);

(c) successively calculating delay values for a signal path specified by an operator, based on the temporary position data calculated in said step (b); and (d) successively displaying on said display screen the delay values calculated in said step (c).

17. A program storage device readable by a computer, tangibly embodying a program of instructions executable by the computer to perform method steps for displaying a channel pass count graph in real time on a display screen in an interactive CAD apparatus for logic circuit packaging design, said method steps comprising:

(a) moving a component, in response to an operator's instruction, on the display screen where a component placement diagram is displayed;

(b) extracting a signal path associated with the component being moved in said step (a), said signal path being comprised of at least one interconnection route;

(c) calculating temporary position data representing a placement position corresponding to the position of said component on said display screen at prescribed intervals of time when said component is being moved in said step (a);

(d) displaying a plurality of horizontal and vertical interconnection channels on said component placement diagram, said interconnection routes passing across said interconnection channels;

(e) based on the temporary position data calculated in said step (c), calculating the number of signal paths that pass across each interconnection channel associated with an interconnection route of the signal path extracted in said step (b); and (f) successively displaying on said display screen a channel pass count graph showing in the form of a graph the number of signal paths calculated in said step (e).

18. A program storage device readable by a computer, tangibly embodying a program of instructions executable by the computer to perform method steps for displaying an interconnection crowdedness map in real time on a display screen in an interactive CAD apparatus for logic circuit packaging design, said method steps comprising:

(a) moving a component, in response to an operator's instruction, on the display screen where a component placement diagram is displayed, said component placement diagram being divided into a plurality of interconnection meshes;

(b) extracting a signal path associated with the component being moved in said step (a), said signal path being comprised of at least one interconnection route;

(c) calculating temporary position data representing a placement position corresponding to the position of said component on said display screen at prescribed intervals of time when said component is being moved in said step (a);

(d) based on the temporary position data calculated in said step (c), calculating the number of signal paths that pass across each interconnection mesh associated with an interconnection route of the signal path extracted in said step (b), the number of signal paths crossing each of said interconnection meshes determining a degree of interconnection crowdedness of each of said interconnection meshes; and (e) successively displaying on said display screen an interconnection crowdedness map showing in the form of a map the degree of interconnection crowdedness of each interconnection mesh in accordance with the magnitude of the number of signal paths calculated in said step (d).

19. An interactive CAD apparatus for logic circuit packaging design, comprising:

component moving means, responsive to an operator's instruction, for moving a component on a display screen where a component placement diagram is displayed;

associated path extraction means for extracting a signal path associated with the component being moved by said component moving means, said signal path being comprised of at least one interconnection route;

temporary position calculation means for calculating temporary position data representing a placement position corresponding to the position of said component on said display screen at prescribed intervals of time when said component is being moved by said component moving means;

a plurality of horizontal and vertical interconnection channels displayed on said component placement diagram, said interconnection routes passing across said interconnection channels;

channel pass count calculation means for calculating, based on the temporary position data calculated by said temporary position calculation means, the number of signal paths that pass across each interconnection channel associated with an interconnection route of the signal path extracted by said associated path extraction means; and channel pass count display means for successively displaying the number of signal paths calculated by said channel pass count calculation means in the form of a graph on said display screen.

20. A method of displaying signal path delay values on a display screen in an interactive CAD apparatus for logic circuit packaging design, comprising the steps of:

(a) moving a component, in response to an operator's instruction, on the display screen where a component placement diagram is displayed;

(b) calculating temporary position data representing a placement position corresponding to the position of said component on said display screen at prescribed intervals of time when said component is being moved in said step (a);

(c) successively calculating delay values for a signal path specified by an operator, based on the temporary position data calculated in said step (b); and (d) successively displaying on said display screen the delay values calculated in said step (c).

21. A method according to claim 20, wherein the step of successively calculating delay values for said signal path calculates the delay values in a simplified manner based on an increase or decrease in inter-component distance as said component is moved.

22. A method according to claim 20, further comprising the step of displaying associated interconnections on the screen where said component placement diagram is displayed, by successively changing the way of displaying said interconnections depending on the magnitude of the delay values successively calculated in the step of successively calculating delay values for said signal path.

23. A method of displaying signal path delay values on a display screen comprising:

calculating temporary position data at prescribed intervals of time representing a placement position corresponding to the position of a component being moved within a component placement diagram on the display screen;

successively calculating delay values for a signal path based on the calculated temporary position data; and successively displaying on the display screen the calculated delay values.

24. A method of displaying a channel pass count graph in real time on a display screen comprising:

calculating temporary position data at prescribed intervals of time representing a placement position corresponding to the position of a component being moved within a component placement diagram on the display screen, the component having an associated signal path specified by an operator and comprised of at least one interconnection route, and the component placement diagram having a plurality of interconnection channels;

based on the temporary position data, calculating the number of signal paths that pass across each interconnection channel associated with the interconnection route; and successively displaying on the display screen the channel pass count graph showing the calculated number of signal paths.

25. A method of displaying an interconnection crowdedness map in real time on a display screen comprising:

calculating temporary position data at prescribed intervals of time representing a placement position corresponding to the position of a component being moved within a component placement diagram on the display screen, the component having an associated signal path specified by an operator and comprised of at least one interconnection route, and the component placement diagram being divided into a plurality of interconnection meshes;

based on the temporary position data, calculating the number of signal paths that pass across each interconnection mesh associated with the interconnection route, the number of signal paths crossing each of the interconnection meshes determining a degree of interconnection crowdedness of each of the interconnection meshes; and successively displaying on the display screen the interconnection crowdedness map showing the degree of interconnection crowdedness of each interconnection mesh in accordance with the magnitude of the calculated number of signal paths.

* * * * *